United States Patent
Yang

(10) Patent No.: US 6,826,067 B2
(45) Date of Patent: Nov. 30, 2004

(54) DOUBLE CAPACITY STACKED MEMORY AND FABRICATION METHOD THEREOF

(75) Inventor: Wu-Der Yang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 59 days.

(21) Appl. No.: 10/424,416

(22) Filed: Apr. 28, 2003

(65) Prior Publication Data
US 2004/0041259 A1 Mar. 4, 2004

(30) Foreign Application Priority Data
Sep. 2, 2002 (TW) .......................... 91119938 A

(51) Int. Cl.$^7$ ................................................ G11C 5/02
(52) U.S. Cl. .................... 365/52; 365/230.03; 365/63
(58) Field of Search ........................ 365/52, 63, 230.03

(56) References Cited

U.S. PATENT DOCUMENTS 4,797,850 A * 1/1989 Amitai ........................ 711/106
6,111,775 A * 8/2000 Schaefer ....................... 365/63

* cited by examiner

Primary Examiner—Hoai Ho
(74) Attorney, Agent, or Firm—Quintero Law Office

(57) ABSTRACT

A double capacity stacked memory device. In the present invention, two memory chips each have a plurality of control terminals and address terminals, and two data input/output terminals. The control terminals and address terminals of the first memory chip are electrically coupled to those of the second memory chip correspondingly to serve as control terminals and address terminals of the stacked memory respectively, and the data input/output terminals of the two memory chips construct four data input/output terminals of the stacked memory, such that the stacked memory accesses data in the first and second memory chip simultaneously according to an access command, and is thus suitable for double capacity memory devices in a standard package.

17 Claims, 2 Drawing Sheets

DOUBLE CAPACITY STACKED MEMORY AND FABRICATION METHOD THEREOF

BACKGROUND OF THE INVENTION

1. Field of the Invention

The present invention relates to a memory device, and in particular to a double capacity stacked memory device with four data input/output terminals suitable for double capacity memory application in a standard package.

2. Description of the Related Art

Because of process technology limitations, the maximum capacity of memory devices can be limited. Furthermore, process technology for small capacity memory devices (256 Mb) is, usually, more stable at lower costs than large capacity memory devices (512 Mb). Thus, it is desirable to obtain a large capacity memory device by stacking small capacity memory devices in one package.

SUMMARY OF THE INVENTION

Accordingly, an object of the invention is to provide a double capacity stacked memory device and method of fabricating the same. This stacked memory device is suitable for double capacity memory device in a standard package regardless of pins or signals from external circuit, thereby obtaining a memory device with doubled capacity.

According to the above mentioned object, the invention provides a stacked memory with four data input/output terminals suitable for double capacity memory device in a standard package.

In the stacked memory of the present invention, a first memory chip has a plurality of control terminals, a plurality of address terminals and two data input/output terminals. A second memory chip has a plurality of control terminals, a plurality of address terminals and two data input/output terminals, wherein the control terminals of the first memory chip are electrically coupled to the control terminals of the second memory chip correspondingly to serve as control terminals of the stacked memory, the address terminals of the first memory chip are electrically coupled to the address terminals of the second memory chip correspondingly to serve as address terminals of the stacked memory, and the two data input/output terminals of the first memory chip and second memory chip construct four data input/output terminals of the stacked memory, such that the stacked memory accesses data in the first and second memory chip simultaneously according to an access command.

According to the above mentioned objects, the present invention provides a method for fabricating a double capacity stacked memory with four data input/output terminals suitable for double capacity memory device in a standard package.

In the method of the present invention, first and second memory chips are provided, each with a plurality of control terminals and address terminals and two input data input/output terminals. Next, the control terminals of the first memory chip are electrically coupled to the control terminals of the second memory chip correspondingly to serve as control terminals of the stacked memory. The address terminals of the first memory chip are then electrically coupled to the address terminals of the second memory chip correspondingly to serve as address terminals of the stacked memory. Finally, the two data input/output terminals of the first memory chip and second memory chip serve as four data input/output terminals of the stacked memory.

A detailed description is given in the following embodiments with reference to the accompanying drawings.

BRIEF DESCRIPTION OF THE DRAWINGS

The present invention can be more fully understood by reading the subsequent detailed description and examples with references to the accompanying drawings, wherein.

DETAILED DESCRIPTION OF THE INVENTION

Figure 1:
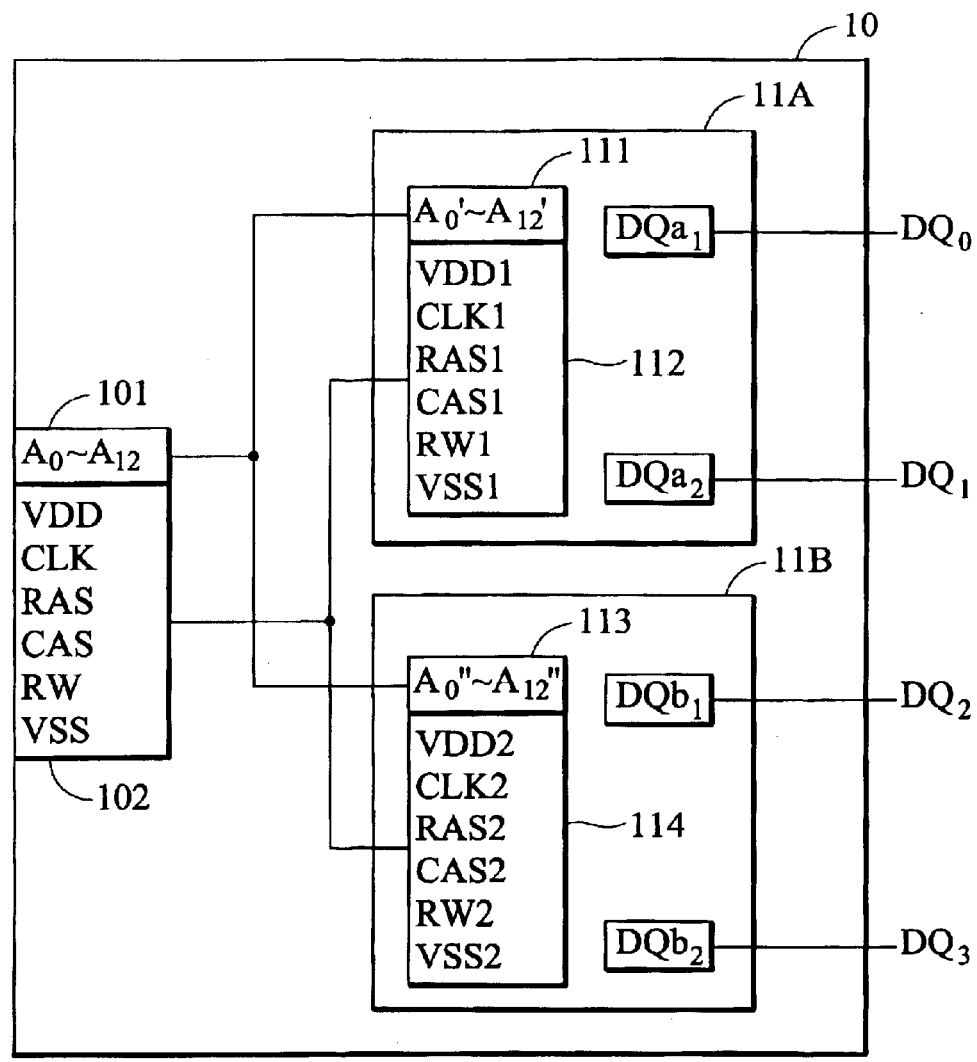
FIG. 1 is a diagram of the stacked memory according to the present invention.

FIG. 1 is a diagram of the stacked memory according to the present invention. As shown in FIG. 1, the stacked memory 10 has a first memory chip 11A, a second memory chip 11B, a plurality of address terminals 101, a plurality of control terminals 102, and four data input/output terminals DQ0~DQ3.

Conventionally, one DRAM device configuration in the industry standard has one data input/output terminal, four data input/output terminals (4DQ), eight data input/output terminals (8DQ) or sixteen data input/output terminals (16DQ), but a DRAM device configuration with two data input/output terminals (2DQ) has been heretofore proposed. In this invention, each memory chip 11A and 11B has two items, namely two data input/output terminals (2DQ). For example, each memory chip 11A and 11B can be a 256 Mb memory chip with two 128 Mb items (2DQ). The first memory chip 11A has a plurality of address terminals 111, a plurality of control terminals 112 and two data input/output terminals DQa1 and DQa2. The second memory chip 12A has a plurality of address terminals 113, a plurality of control terminals 113 and two data input/output terminals DQb1 and DQb2. The address terminals 111 correspond to the address terminals 113, and the control terminals 112 correspond to the control terminals 114.

The address terminals 111 include terminals A0'~A12', and the address terminals 113 include terminals A0"~A12". The control terminals 112 include at least a power supply terminal VDD1, a ground terminal VSS1, chip select terminal CS, command terminals RAS1, CAS1 and WE1 and the like. Also, the control terminals 114 include at least a power supply terminal VDD1, a ground terminal VSS1, chip select terminal CS, command terminals RAS1, CAS1 and WE1 and the like. Each address terminals 111 is electrically coupled to the corresponding address terminal 113 by bonding wire, according to its definition, to serve as the address terminals 101 of the stacked memory 10. Each control terminals 112 is electrically coupled to the corresponding control terminal 114 by bonding wire, according to its definition, to serve as the control terminals 102 of the stacked memory 10.

The stacked memory 10 also has a substrate (not shown) with pins (or contacts) having the same definition as the chips 11A and 11B. The chips 11A and 11B are mounted on the substrate, for example, a lead frame or a printed circuit board. The two data input/output terminals DQa1 and DQa2 of the chip 11A and the two data input/output terminals DQb1 and DQb2 serve as the four data input DQ0~DQ3 of the stacked memory 10.

For example, the data input/output terminals DQa1 and DQa2 of the first memory chip 11A can serve as the high-bit portion of the four data input/output terminals DQ0~DQ3 of the stacked memory, and the two data input/output terminals DQb1 and DQb2 of the second memory chip 11B serve as the low-bit portion of the four data input/output terminals DQ0~DQ3 of the stacked memory 10, and vice versa. The data input/output terminals DQa1, DQa2, DQb1 and DQb2 are electrically connected correspondingly by bonding wire.

Figure 2:
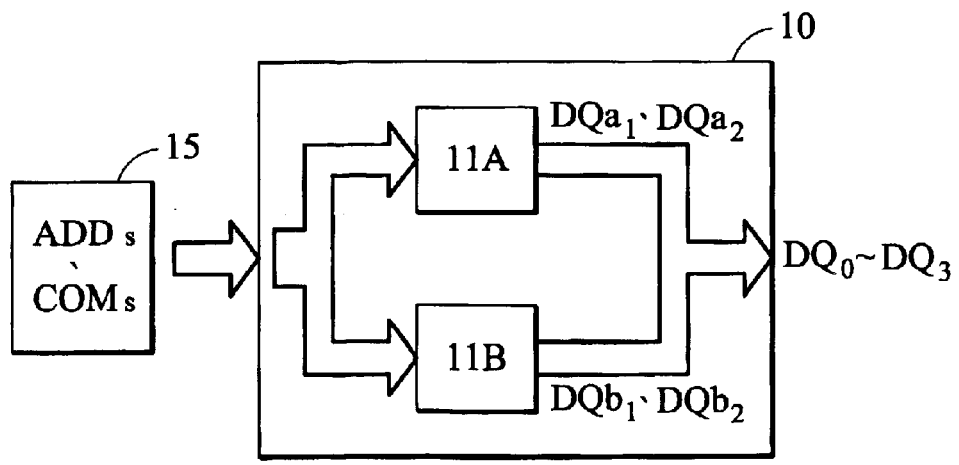
FIG. 2 is another diagram of the stacked memory according to the present invention.

FIG. 2 is a diagram illustrating the operation of the stacked memory. In this embodiment of the present invention, each first and second memory chips 11A and 11B is a 256 Mb memory chip with two 128 Mb items (128 Mb×2). Thus, the stacked memory is a 512 Mb memory device with four 128 Mb items (128 Mb×4), while it is to be understood that the invention is not limited to these embodiments.

In the stacked memory of the present invention, the first memory chip 11A and second memory chip 11B are accessed simultaneously according to an access command. As shown in FIG. 2, the stacked memory 10 receives an access command 15, wherein the access command includes a plurality of address signals ADDs and a plurality of control signals COMs and the like. The stacked memory 10 reads the data stored at addresses (100, 100) in the memory chips 11A and 11B and outputs them through the data input/output terminals DQ0~DQ3 when the control signals COMs include a read signal and the address signals represent the address (100, 100). As well, the stacked memory 10 receives data from the terminals DQ0~DQ3 and stores it at addresses (100, 100) in the memory chips 11A and 11B when the control signals COMs include a programming signal and the address signals represent the address (100, 100).

In another aspect of the present invention, each first memory chip 11A and second memory chip 11B is a 512 Mb memory chip with two 256 Mb items (256 Mb×2), packaged in a thin small outline package type 1 (TSOP I), thin small outline package type2 (TSOP II) or the like. At this time, the stacked memory 10 is a 1024 Mb memory device (256 Mb×4).

Also, in another aspect of the present invention, each first memory chip 11A and second memory chip 11B is a 128 Mb memory chip with two 64 Mb items (64 Mb×2), packaged in a thin small outline package type 1 (TSOP I), thin small outline package type 2 (TSOP II) or the like. At this time, the stacked memory 10 is a 256 Mb memory device (64 Mb×4).

Figure 3:
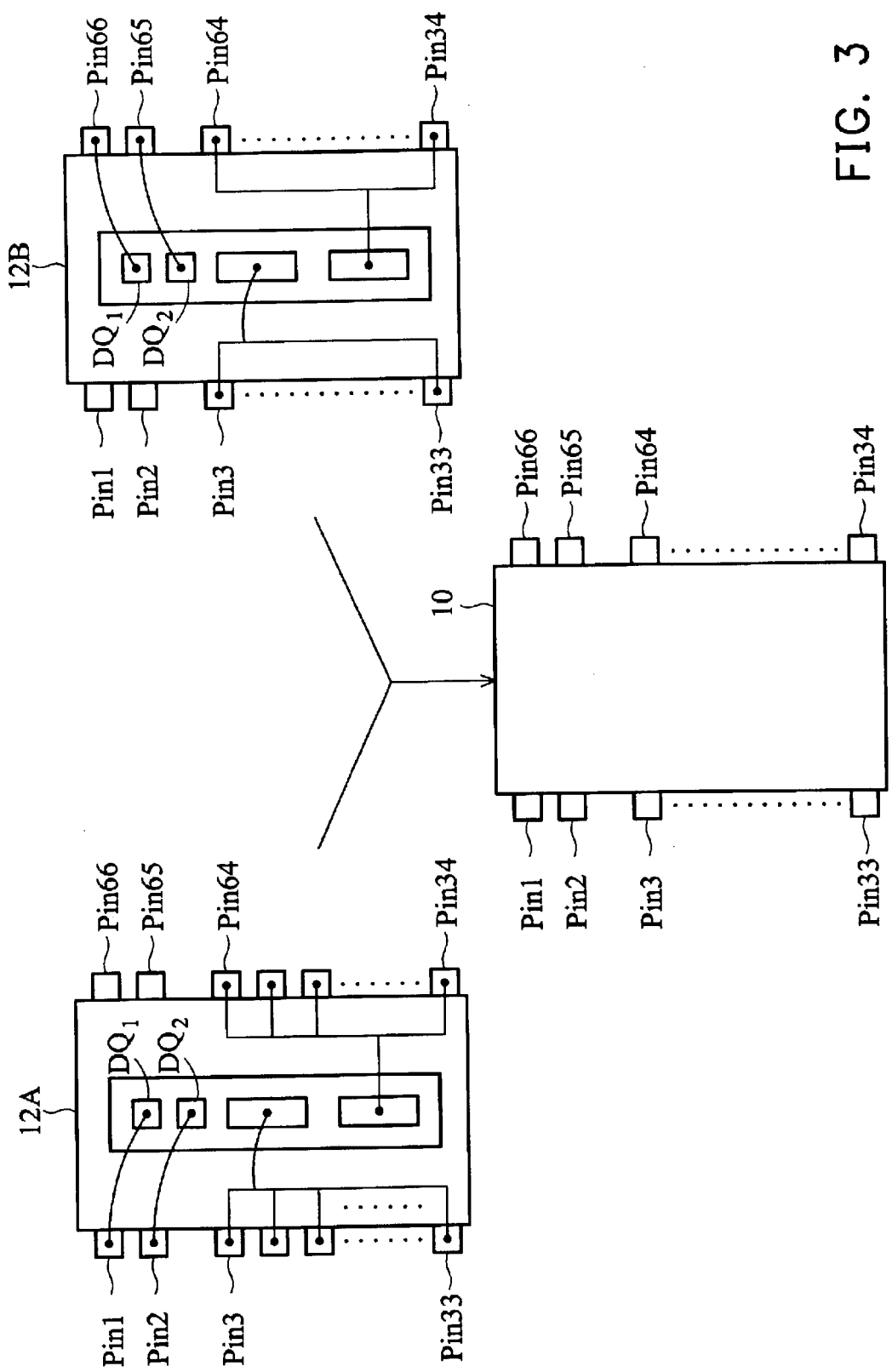
FIG. 3 is another diagram of the stacked memory according to the present invention.

FIG. 3 illustrates another embodiment according to the present invention. As shown in FIG. 3, the stacked memory 10 includes a first memory unit 12A, a second memory unit 12B, a plurality of address leads (pin3~pin 33), a plurality of control leads (pin34~pin64) and four data input/output leads (pin1, pin2, pin65 and pin 66).

For example, each memory unit 12A and 12B is a 256 Mb memory device with two 128 Mb items, packaged in a thin small outline package (TSOP). Each memory unit 12A and 12B has address leads pin3~pin33, control leads pin34~pin64 and two data input/output leads pin1 and pin2. The control leads of the memory unit 12A correspond to those of the memory unit 12B, and the address leads of the memory unit 12A also correspond to those of the memory unit 12B.

The address leads pin3~pin33 of the memory unit 12A include address input leads A0'~A12', and the address leads pin3~pin33 of the memory unit 12B include address input leads A0"~A12". The control leads pin34~pin64 of the memory unit 12A include at least a power supply lead VDD1, a ground lead VSS1, chip select lead CS, command leads RAS1, CAS1 and WE1 and the like. The control leads pin34~pin64 of the memory unit 12B include at least a power supply lead VDD1, a ground lead VSS1, chip select lead CS, command leads RAS1, CAS1 and WE1 and the like. Each address terminals 111 is electrically coupled to the corresponding address terminal 113 according to its definition, to serve as the address terminals 101 of the stacked memory 10. Each control terminals 112 is electrically coupled to the corresponding control terminal 114 by bonding wire, according to its definition, to serve as the control terminals 102 of the stacked memory 10. The corresponding leads of the memory unit 12A and 12B are electrically coupled to each other by bonding wire according to their definition. Then, the address leads of the memory unit 12A and 12B serve as the address leads pin3~pin33 of the stacked memory 10, and the control leads of the memory unit 12A and 12B serve as the control leads pin34~pin64 of the stacked memory 10.

In addition, the first memory unit 12A transmits data through the data input/input leads pin1 and pin2, and the leads pin65 and pin66 are non-connected. Also, the second memory unit 12B transmits data through input/output leads pin65 and pin66, and the leads pin1 and pin2 are non-connected. The data input/output leads pin1 and pin2 of the memory unit 12A and that leads pin65 and pin66 of the memory unit 12B construct the four data input/output leads pin1, pin2, pin65 and pin66 of the stacked memory 10. The operation of this stacked memory 10 in FIG. 3 is the same as the memory in FIG. 2.

Therefore, the invention can fabricate a double capacity stacked memory device by packaging two memory chips with the same capacity in one package, suitable for double capacity memory device in a standard package regardless of pins or signals from external circuit, thereby obtaining a large capacity memory device.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A stacked memory device, comprising:
   a first memory chip having a plurality of control terminals, a plurality of address terminals and two data input/output terminals; and
   a second memory chip having a plurality of control terminals, a plurality of address terminals and two data input/output terminals, wherein the control terminals of the first memory chip are electrically coupled to the control terminals of the second memory chip correspondingly to serve as control terminals of the stacked memory, the address terminals of the first memory chip are electrically coupled to the address terminals of the second memory chip correspondingly to serve as address terminals of the stacked memory, and the two data input/output terminals of the first memory chip and second memory chip construct four data input/output terminals of the stacked memory, such that the stacked memory accesses data in the first and second memory chip simultaneously according to an access command.

2. The stacked memory as claimed in claim 1, further comprising:
   a lead frame with terminals connected to the first and second memory chip, wherein the control terminals, address terminals and data input/output terminals are electrically coupled to the corresponding terminals of the lead frame correspondingly.

3. The stacked memory as claimed in claim 1, further comprising:
 a printed circuit board (PCB) with contacts to the first and second memory chip, wherein the control terminals, address terminals and data input/output terminals are electrically coupled to the contacts of the printed circuit board correspondingly.

4. The stacked memory as claimed in claim 1, wherein the control terminals and the address terminals of the first memory chip are electrically coupled to the control terminals and the address terminals of the second memory chip correspondingly by bonding wire.

5. The stacked memory as claimed in claim 1, wherein each first and second memory chip is a memory chip with capacity of 256 Mb (128×2), such that total capacity of the stacked memory is 512 Mb (128×4).

6. The stacked memory as claimed in claim 1, wherein each first and second memory chip is a memory chip with capacity of 128 Mb (64×2), such that total capacity of the stacked memory is 256 Mb (64×4).

7. The stacked memory as claimed in claim 1, wherein each first and second memory chip is a memory chip with capacity of 512 Mb (256×2), such that total capacity of the stacked memory is 1024 Mb (256×4).

8. A stacked memory device, composing:
 a first memory unit having a plurality of control pins, a plurality of address pins and two data input/output pins; and
 a second memory unit having a plurality of control pins, a plurality of address pins and two data input/output pins, wherein the control pins of the first memory chip are electrically coupled to the control terminals of the second memory chip respectively to serve as control terminals of the stacked memory, the address pins of the first memory chip are electrically coupled to the address pins of the second memory chip respectively to serve as address pins of the stacked memory, and the two data input/output pins of the first memory chip and second memory chip serve as four data input/output pins of the stacked memory, such that the stacked memory accesses data in the first and second memory unit simultaneously according to an access command.

9. The stacked memory as claimed in claim 8, wherein each first and second memory unit is a 256 Mb memory within a thin small outline package type 1 (TSOP I).

10. The stacked memory as claimed in claim 8, wherein each first and second memory unit is a 256 Mb memory within a thin small outline package type 2 (TSOP II).

11. The stacked memory as claimed in claim 8, wherein the control terminals and the address terminals of the first memory unit are electrically coupled to the control terminals and the address terminals of the second memory unit correspondingly by bonding wire.

12. A stack packaging method for fabricating a stacked memory with standard four data input/output terminals, comprising:
 providing first and second memory chips, each having a plurality of control terminals and address terminals and two input data input/output terminals;
 electrically coupling the control terminals of the first memory chip to the control terminals of the second memory chip correspondingly to serve as control terminals of the stacked memory;
 electrically coupling the address terminals of the first memory chip to the address terminals of the second memory chip correspondingly to serve as address terminals of the stacked memory; and
 using the two data input/output terminals of the first memory chip and second memory chip as four data input/output terminals of the stacked memory.

13. The method as claimed in claim 12, wherein the two data input/output terminals of the first memory chip serve as the high-bit portion of the four data input/output terminals of the stacked memory, and the two data input/output terminals of the second memory chip serve as the low-bit portion of the four data input/output terminals of the stacked memory.

14. The method as claimed in claim 12, further comprising a step of providing a lead frame with terminals connected to the first and second memory chip, wherein the control terminals, address terminals and data input/output terminals are electrically coupled to the corresponding terminals of the lead frame correspondingly.

15. The method as claimed in claim 12, further comprising a step of providing a printed circuit board (PCB) with contacts to the first and second memory chip, wherein the control terminals, address terminals and data input/output terminals are electrically coupled to the contacts of the printed circuit board correspondingly.

16. The method as claimed in claim 12, wherein the control terminals and the address terminals of the first memory chip are electrically coupled to the control terminals and the address terminals of the second memory chip correspondingly by bonding wire.

17. The method as claimed in claim 12, wherein each first and second memory chip is a memory chip with capacity of 256 Mb (128×2), such that total capacity of the stacked memory is 512 Mb (128×4).

* * * * *